US011239797B1

(12) United States Patent
El-Aassar et al.

(10) Patent No.: US 11,239,797 B1
(45) Date of Patent: Feb. 1, 2022

(54) REGENERATIVE FREQUENCY DOUBLER

(71) Applicant: QUALCOMM Incorporated, San Diego, CA (US)

(72) Inventors: Omar Essam El-Aassar, La Jolla, CA (US); Bhushan Shanti Asuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/157,855

(22) Filed: Jan. 25, 2021

(51) Int. Cl.
*H03B 19/10* (2006.01)
*H03B 21/01* (2006.01)
*H03D 7/14* (2006.01)
*H03B 19/14* (2006.01)
*H04B 1/40* (2015.01)
*H03K 5/00* (2006.01)

(52) U.S. Cl.
CPC ............. *H03B 21/01* (2013.01); *H03B 19/10* (2013.01); *H03B 19/14* (2013.01); *H03D 7/1458* (2013.01); *H03K 5/00006* (2013.01); *H04B 1/40* (2013.01); *H03B 2200/007* (2013.01); *H03B 2202/05* (2013.01); *H03D 2200/009* (2013.01)

(58) Field of Classification Search
CPC ........ H03B 19/06; H03B 19/10; H03B 19/14; H03B 21/01; H03B 2200/007; H03B 2200/0088; H03B 2200/009; H03B 2202/05; H03D 7/1458; H03K 5/00006; H04B 1/40
See application file for complete search history.

(56) References Cited

U.S. PATENT DOCUMENTS

| 6,564,045 | B1* | 5/2003 | Fransis | H03D 7/1433 455/189.1 |
| 2004/0198297 | A1* | 10/2004 | Oh | H03B 27/00 455/318 |
| 2006/0154625 | A1* | 7/2006 | Malone | H04B 1/30 455/118 |
| 2007/0072577 | A1* | 3/2007 | Rozenblit | H03L 7/1978 455/333 |
| 2007/0116015 | A1* | 5/2007 | Jones | H03D 7/1441 370/396 |
| 2008/0068052 | A1* | 3/2008 | Tsai | H03B 19/14 327/116 |
| 2008/0181340 | A1* | 7/2008 | Maxim | H03D 7/165 375/346 |
| 2009/0190692 | A1* | 7/2009 | Aniruddhan | H03D 7/1458 375/295 |
| 2009/0225897 | A1* | 9/2009 | Toyota | H04B 1/0475 375/295 |
| 2012/0120992 | A1* | 5/2012 | Soltanian | H03L 7/193 375/221 |
| 2012/0161845 | A1* | 6/2012 | Pehlivanoglu | H04B 1/44 327/356 |
| 2014/0091849 | A1* | 4/2014 | Zienkewicz | H03D 7/1458 327/355 |
| 2021/0159929 | A1* | 5/2021 | Wu | H03H 7/21 |

* cited by examiner

*Primary Examiner* — Levi Gannon
(74) *Attorney, Agent, or Firm* — Haynes and Boone, LLP

(57) ABSTRACT

A frequency doubler is provided that filters an input signal to form I and Q components responsive to a tuning signal. A single sideband mixer mixes the I and Q components with I and Q components of a local oscillator signal to form an output signal having a frequency of twice the frequency of the input signal.

28 Claims, 6 Drawing Sheets

REGENERATIVE FREQUENCY DOUBLER

TECHNICAL FIELD

This application relates to a frequency doubler, and more particularly to a regenerative frequency doubler.

BACKGROUND

Radio transceivers use oscillators such as a voltage-controlled oscillator (VCO) to generate various radio frequency (RF) signals. For example, a VCO may be incorporated into a phase-locked loop to generate a local oscillator (LO) signal. But the generation of a stable frequency reference at higher frequencies becomes more and more problematic. It is thus known to generate an oscillating input signal from a VCO that is then doubled in a frequency doubler to provide an output oscillator signal that has a frequency that is twice the frequency of the input signal. The resulting combination of a VCO with the frequency doubler can enable the VCO to function with a better phase noise, reduced power consumption and improved tuning range as compared to an alternative VCO (if available) that can generate the doubled frequency directly. But the use of a frequency doubler is typically associated with the production of undesired spurs that can violate the desired emission mask. In addition, the resulting spurs may set a limit on the achievable power levels.

SUMMARY

In accordance with a first aspect of the disclosure, a frequency doubler is provided that includes: a first pair of Gilbert cells configured to mix a differential in-phase input signal with a differential in-phase local oscillator signal to drive a differential output signal at a pair of output nodes; a second pair of Gilbert cells configured to mix a differential quadrature-phase input signal with a differential quadrature-phase local oscillator signal to drive the differential output signal at the pair of output nodes; and a frequency divider configured to divide the differential output signal into the differential in-phase local oscillator signal and into the differential quadrature-phase local oscillator signal.

In accordance with a second aspect of the disclosure, a method of frequency doubling is provided that includes: filtering a differential input signal into a differential in-phase input signal and a differential quadrature-phase input signal responsive to a tuning signal; mixing the differential in-phase input signal with a differential in-phase local oscillator signal to drive a differential output signal; mixing the differential quadrature-phase input signal with a differential quadrature-phase local oscillator signal to drive the differential output signal; filtering the differential output signal to block a DC signal from the differential output signal; and converting the DC signal into the tuning signal.

In accordance with a third aspect of the disclosure, a frequency doubler is provided that includes: a tunable input filter configured to filter a differential input signal responsive to a tuning signal to form a differential in-phase input signal and a differential quadrature-phase input signal; a frequency divider configured to divide a differential output signal in frequency by a factor of two to produce a differential in-phase local oscillator signal and a differential quadrature-phase local oscillator signal; a single sideband mixer configured to mix the differential in-phase input signal with the differential in-phase local oscillator signal and to mix the differential quadrature-phase input signal with the differential quadrature-phase local oscillator signal to produce the differential output signal at a pair of output nodes; and a DC-blocking output filter coupled between the pair of output nodes.

In accordance with a fourth aspect of the disclosure, a method of frequency doubling is provided that includes: filtering a differential input signal responsive to a tuning signal into a differential in-phase input signal and a differential quadrature-phase input signal; dividing a differential output signal in frequency by a factor of two to form a differential in-phase local oscillator signal and a differential quadrature-phase local oscillator signal; forming the differential output signal by mixing the differential in-phase input signal with the differential in-phase local oscillator signal and by mixing the differential quadrature-phase input signal with the differential quadrature-phase local oscillator signal; and filtering the differential output signal in a DC-blocking output filter.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A frequency doubler is provided with reduced spurs. The frequency doubler include a frequency divider that divides an output signal in frequency by a factor of two to generate a local oscillator signal. A single sideband mixer mixes the local oscillator signal with a differential input signal to generate the output signal. Since the feedback through the frequency divider to the mixer is positive in that the output signal has a frequency that is twice a frequency of the input signal, the frequency doubler disclosed herein may be deemed to be a regenerative frequency doubler.

The spur reduction provided by the frequency doubler results from several innovations. For example, the frequency doubler includes a tunable input filter such as a tunable polyphase filter to process a differential input signal into differential in-phase (I) and differential quadrature-phase (Q) versions of the differential input signal. In addition, the frequency doubler includes a DC-blocking output filter that blocks DC signals from the differential output signal. Any DC component that would otherwise be generated in the mixer and be present in the differential output signal is thus blocked by the DC-blocking output filter. A feedback path converts the blocked DC signal into a tuning signal to tune the tunable input filter so that the DC component can be further reduced.

The mixer uses complementary Gilbert cells for both the I and Q channels. The frequency divider divides the differential output signal into both a differential in-phase local oscillator signal and into a differential quadrature-phase local oscillator signal. The differential in-phase local oscillator signal and the differential in-phase input signal drive a first pair of complementary Gilbert cells. Similarly, the differential quadrature-phase local oscillator signal and the differential quadrature-phase input signal drive a second pair of complementary Gilbert cells. Each pair of complementary Gilbert cells includes a p-type metal-oxide semiconductor (PMOS) Gilbert cell and an n-type metal-oxide semiconductor (NMOS) Gilbert cell. Each PMOS Gilbert cell couples between a power supply node and a pair of output nodes for the differential output signal. Similarly, each NMOS Gilbert cell couples between ground and the pair of output nodes.

Figure 1:
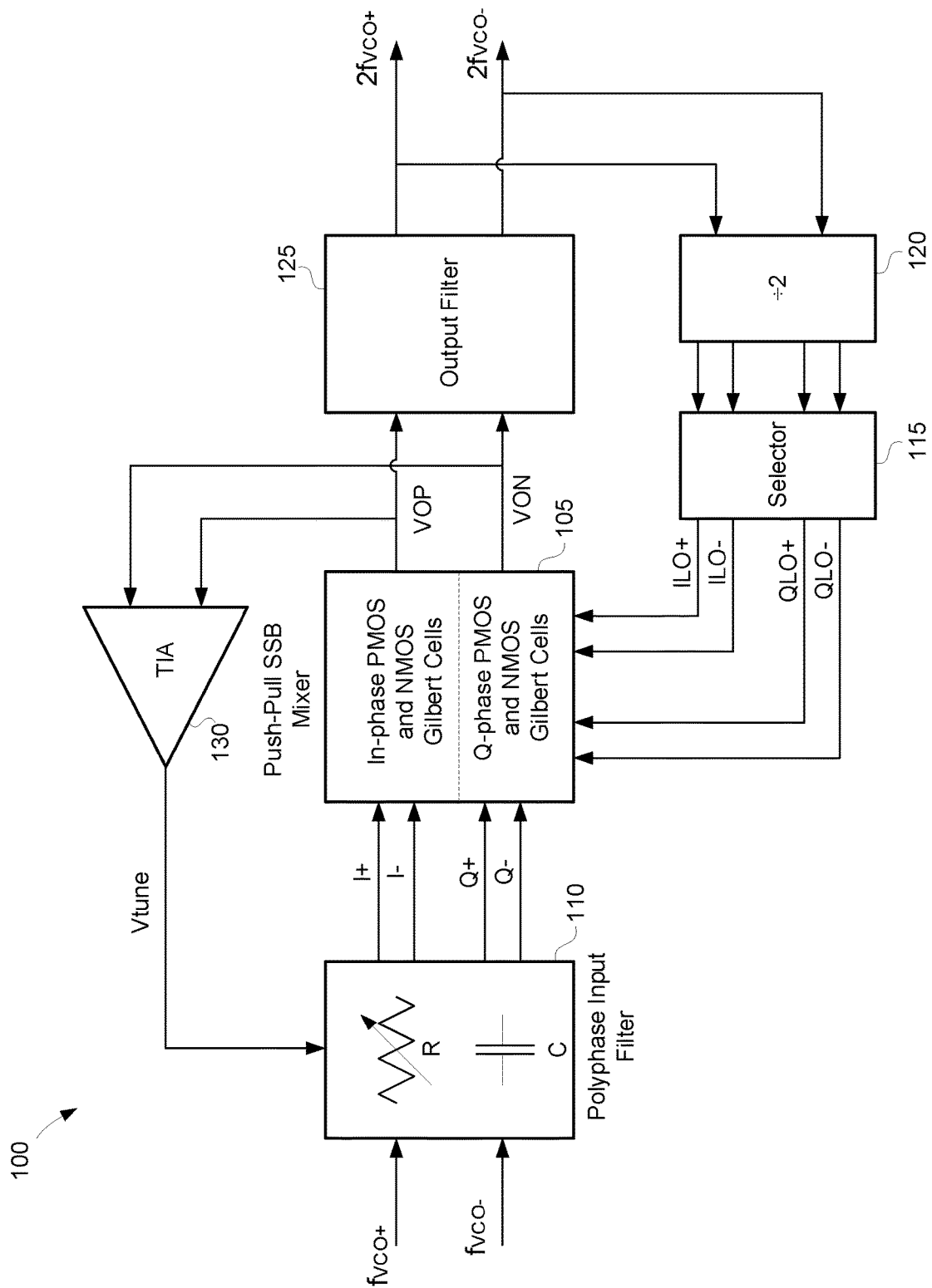
FIG. 1 illustrates an example frequency doubler in accordance with an aspect of the disclosure.

An example frequency doubler 100 is shown in FIG. 1. A tunable polyphase filter 110 functions as a quadrature generator to generate an in-phase and a quadrature-phase version of a differential VCO input signal that has a positive component fVCO+ and a negative component fVCO−. The differential VCO input signal has a frequency of fVCO such that the frequency doubling in frequency doubler 100 produces a frequency of 2fVCO in a differential output signal having a positive component 2fVCO+ and a negative component 2fVCO−. In a default state, polyphase filter 110 may function to delay the differential VCO input signal in phase by 45 degrees to form a differential in-phase input signal having a positive component I+ and a negative component I−. Similarly, polyphase filter 110 may function to advance the differential VCO input signal in phase by 45 degrees to form a differential quadrature-phase input signal having a positive component Q+ and a negative component Q−. If the tunable polyphase filter 110 is functioning ideally, the resulting quadrature-phase signals Q+ and Q− are advanced in phase by 90 degrees with respect to the in-phase signals I+ and I−. With this ideal I/Q balance, the differential output signal would have no output spurs at the even harmonic frequencies of 0*fVCO, 4*fVCO, 8*fVCO, and so on. But in reality, no real-world polyphase filter functions perfectly such that there is an imbalance (deviation from quadrature) between the I and Q components. This I/Q imbalance may produce even harmonic output signal spurs in the differential output signal for frequency doubler 100. Since 0*fVCO is a direct current (DC) signal, frequency doubler 100 includes a DC-blocking output filter 125 that blocks this DC signal. To reduce the output spurs at these even harmonics, frequency doubler 100 includes a feedback path such as implemented through a transimpedance amplifier 130 that converts a DC current from a pair of output nodes VOP and VON at the Gilbert cells into a tuning voltage Vtune. Transimpedance amplifier 130 may include a low-pass filter to ensure that it responds only to the DC current. Tunable polyphase filter 110 responds to the tuning voltage Vtune by adjusting the phasing of the differential in-phase and quadrature-phase input signals. The resulting negative feedback through the transimpedance amplifier 130 and the tunable polyphase filter 110 reduces the I/Q imbalance such that the even harmonic output spurs are reduced or substantially eliminated. As known in the polyphase filter arts, tunable polyphase filter 110 may be constructed using a network of capacitors and tunable resistors. The tunable resistors may be implemented using transistors that respond to the tuning voltage Vtune to provide adjustable resistance for the I/Q balancing. Alternatively, the capacitors may also be adaptive. It will be appreciated that the tunable polyphase filter 110 may be replaced by other adaptive quadrature filters such as a tunable lumped-element hybrid 90-degree coupler or delay-tunable transmission lines. Alternatively, a tunable quadrature VCO may be used to generate the differential in-phase and quadrature-phase input signals directly such that the quadrature VCO itself functions as the tunable input filter.

The differential in-phase and quadrature-phase input signals may be buffered in corresponding buffers (not illustrated) prior to mixing in a single-sideband (SSB) mixer 105. SSB mixer 105 includes two pairs of complementary (PMOS and NMOS) Gilbert cells. A first pair of complementary Gilbert cells performs the in-phase mixing of the differential in-phase input signal I+ and I− with a differential in-phase local oscillator signal having a positive component ILO+ and a negative component ILO−. Similarly, a second pair of complementary Gilbert cells performs the quadrature-phase mixing of the differential quadrature-phase input signal Q+ and Q− with a differential quadrature-phase local oscillator signal having a positive component QLO+ and a negative component QLO−.

A frequency divider 120 and a selector circuit 115 produce the differential local oscillator signals from the differential output signal. The frequency divider 120 functions to divide the differential output signal oscillating at the frequency of 2fVCO into a pair of differential signals that oscillate at the frequency of fVCO. The frequency division by frequency divider produces a quadrature phase relationship for the differential pair of signals it produces but it may not be able to guarantee which of its differential signals in the pair is leading or lagging by this quadrature phase relationship. Selector circuit 115 thus functions to select from the pair of differential signals so that the differential quadrature-phase local oscillator signal is in fact leading the differential in-phase local oscillator signal by the desired quadrature phase relationship.

Figure 2A:
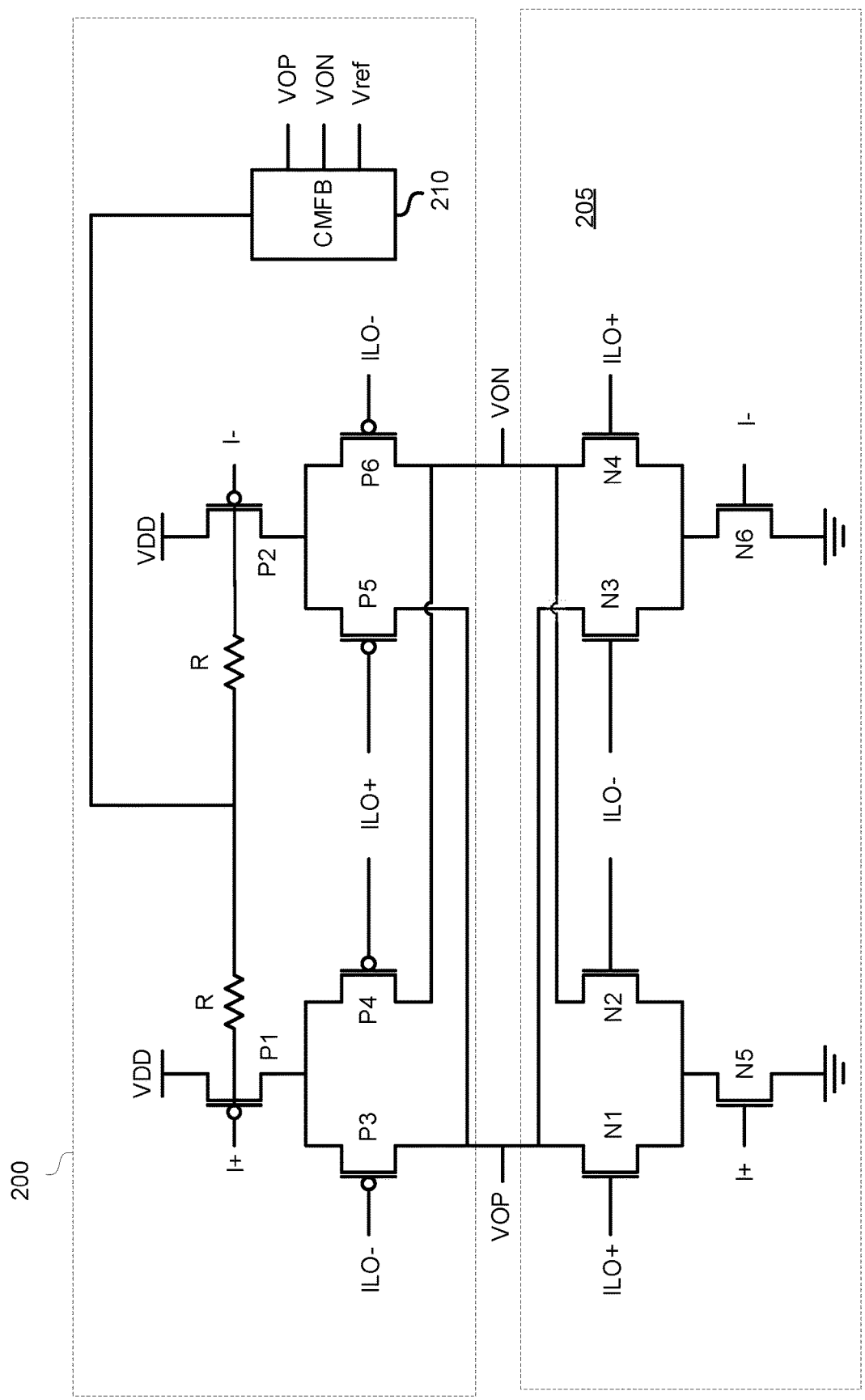
FIG. 2A is a circuit diagram of an in-phase pair of complementary Gilbert cells for a single sideband mixer in accordance with an aspect of the disclosure.

The complementary Gilbert cells for the in-phase mixing in SSB mixer 105 are shown in more detail for an example embodiment in FIG. 2A. A PMOS Gilbert cell 200 includes a first PMOS transistor P1 having a source connected to a power supply node for a power supply voltage VDD and a drain connected to the sources of a pair of PMOS transistors P3 and P4. Similarly, a second PMOS transistor P2 has a source connected to the power supply node and a drain connected to the sources of a pair of PMOS transistors P5 and P6. The positive component I+ of the differential in-phase input signal drives the gate of transistor P1 whereas the negative component I− of the differential in-phase input signal drives the gate of transistor P2. The negative component ILO− of the differential in-phase local oscillator signal drives the gate of transistors P3 and P6. Similarly, the positive component ILO+ of the differential in-phase local oscillator signal drives the gate of transistors P4 and P5. PMOS Gilbert cell 200 is thus doubly-balanced as it is differential to both of the signals it is mixing.

The drain of transistor P4 connects to the drain of transistor P6 that in turn connects to a negative output node VON for the negative component 2fVCO− of the differential output signal. Similarly, the drain of transistor P5 connects to the drain of transistor P3 that in turn connects to a positive output node VOP for the positive component 2fVCO+ of the differential output signal. The gates of transistors P1 and P2 are coupled together through a serial pair of resistors R. A common-mode feedback circuit (CMFB) 205 responds to the difference between the differential output signals and a reference voltage Vref to bias a node between the resistors R with a common-mode voltage for the gates of transistors P1 and P2. In this fashion, the common-mode voltage for the differential output signal may be adjusted to equal a desired value such as equal to the reference voltage Vref.

An NMOS Gilbert cell 205 includes an NMOS transistor N5 having a source connected to ground and a drain connected to the sources of a pair of NMOS transistors N1 and N2. Similarly, an NMOS transistor N6 has a source connected to ground and a drain connected to the sources of a pair of NMOS transistors N3 and N4. The positive component I+ of the differential in-phase input signal drives the gate of transistor N5 whereas the negative component I– of the differential in-phase input signal drives the gate of transistor N6. The negative component ILO– of the differential in-phase local oscillator signal drives the gate of transistors N2 and N3. Similarly, the positive component ILO+ of the differential in-phase local oscillator signal drives the gate of transistors N1 and N4. NMOS Gilbert cell 205 is thus doubly-balanced as it is differential to both of the signals it is mixing.

The drain of transistor N2 connects to the drain of transistor N4 that in turn connects to the negative output node VON. Similarly, the drain of transistor N3 connects to the drain of transistor N1 that in turn connects to a positive output node VOP. Given the complementary nature of Gilbert cells 200 and 205, SSB mixer 105 may be denoted as a push-pull mixer. For example, suppose that the in-phase component I+ is high (charged to the power supply voltage VDD) so that the in-phase component I– is low (ground). Transistors N5 and P2 will then be on whereas transistors P1 and N6 are off. If the ILO+ component is high, transistor N1 is on and transistor N2 is off. In that case, the VOP node discharges through switched-on transistors N1 and N5 (the pull). Since the ILO+ component is high, the ILO– component is low, which switches on transistor P6 and switches off transistor P5. The VON node will thus be charged through the conduction by transistor P2 and P6 (the push).

Should the I+ component be high while the ILO– component is high, the VON node will discharge through transistors N2 and N5. In the same scenario, the VOP node is charged through transistors P2 and P5. An analogous set of pushes and pulls occurs when both I– and the ILO+ components are high. In that case, the VON node discharges through transistors N6 and N4 while the VOP node is charged through transistors P1 and P3. Finally, if the I– and the ILO– components are both high, the VOP node discharges through transistors N3 and N6 while the VON node is charged through transistors P1 and P4.

Figure 2B:
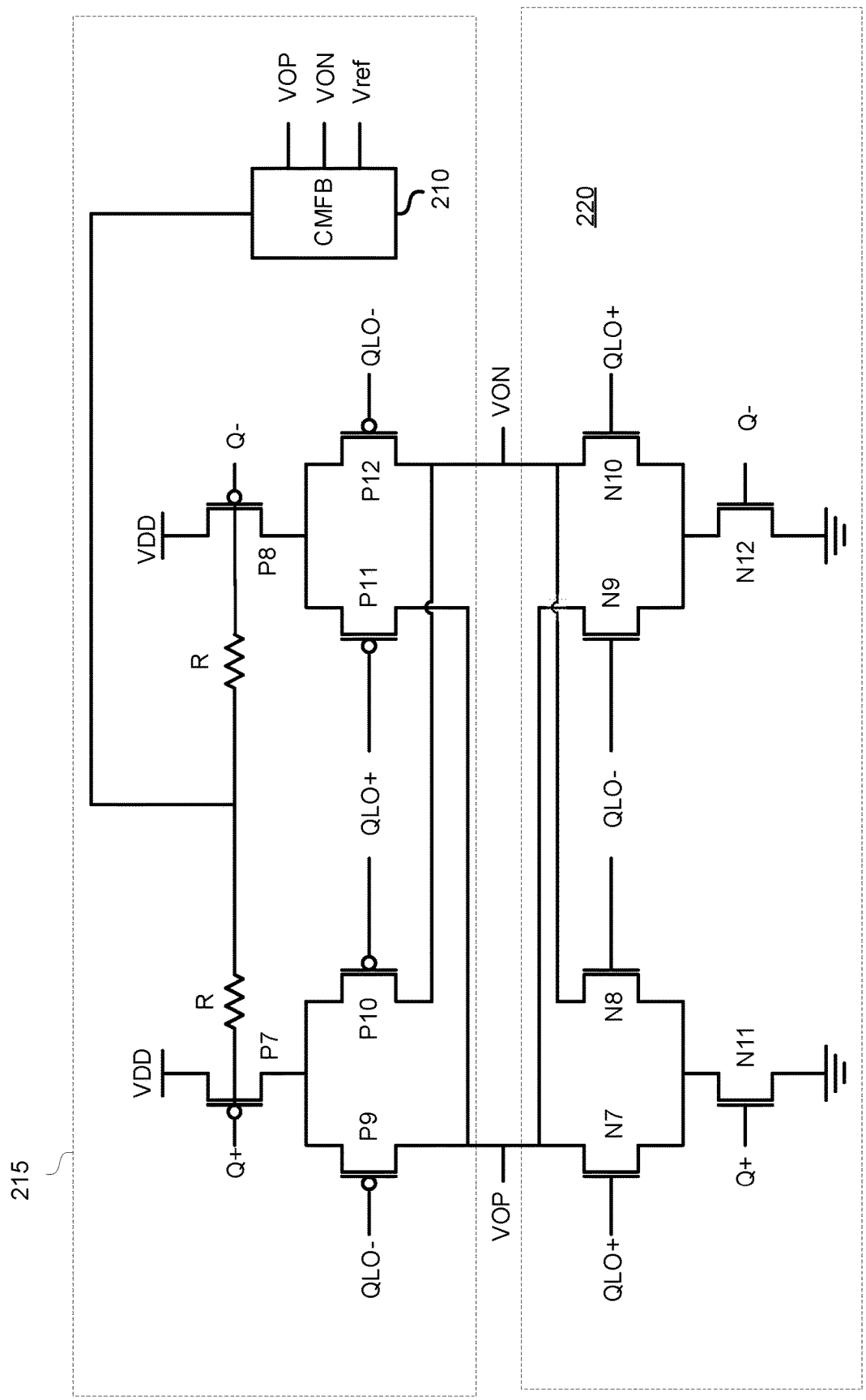
FIG. 2B is a circuit diagram of a quadrature-phase pair of complementary Gilbert cells for a single sideband mixer in accordance with an aspect of the disclosure.

An analogous complementary (push-pull) set of PMOS and NMOS Gilbert cells mix the quadrature-phase signals. An example PMOS Gilbert cell 215 for the quadrature-phase mixing is shown in FIG. 2B that is arranged analogously as discussed for PMOS Gilbert cell 200. PMOS Gilbert cell 215 includes a PMOS transistor P7 having a source connected to the power supply node and a drain connected to the sources of a pair of PMOS transistors P9 and P10. Similarly, a PMOS transistor P8 has a source connected to the power supply node and a drain connected to the sources of a pair of PMOS transistors P11 and P12. The positive component Q+ of the differential quadrature-phase input signal drives the gate of transistor P7 whereas the negative component Q– of the differential quadrature-phase input signal drives the gate of transistor P8. The negative component QLO– of the differential quadrature-phase local oscillator signal drives the gate of transistors P9 and P12. Similarly, the positive component QLO+ of the differential quadrature-phase local oscillator signal drives the gate of transistors P10 and P11. PMOS Gilbert cell 200 is thus doubly-balanced as it is differential to both of the signals it is mixing.

The drain of transistor P10 connects to the drain of transistor P12 that in turn connects to the negative output node VON. Similarly, the drain of transistor P11 connects to the drain of transistor P9 that in turn connects to the positive output node VOP. The gates of transistors P7 and P8 are coupled together through another serial pair of resistors R. The common-mode feedback circuit (CMFB) 205 biases the node between the resistors R as discussed with regard to PMOS Gilbert cell 200.

An NMOS Gilbert cell 220 is analogous to NMOS Gilbert cell 205. NMOS Gilbert cell 220 includes an NMOS transistor N11 having a source connected to ground and a drain connected to the sources of a pair of NMOS transistors N7 and N8. Similarly, an NMOS transistor N12 has a source connected to ground and a drain connected to the sources of a pair of NMOS transistors N9 and N10. The positive component Q+ of the differential quadrature-phase input signal drives the gate of transistor N11 whereas the negative component Q– drives the gate of transistor N12. The negative component QLO– of the differential quadrature-phase local oscillator signal drives the gate of transistors N8 and N9. Similarly, the positive component QLO+ of the differential quadrature-phase local oscillator signal drives the gate of transistors N7 and N10. NMOS Gilbert cell 220 is thus doubly-balanced as it is differential to both of the signals it is mixing. Given the analogous construction of quadrature-phase Gilbert cells 220 and 215 to their in-phase counterparts 205 and 200, the complementary charging and discharging of the VOP and VON nodes by the quadrature-phase Gilbert cells 220 and 215 will not be described in detail as it occurs analogously as described for the in-phase Gilbert cells 205 and 200.

Whenever two sinusoidal signals are multiplied such as in the multiplication of an input VCO signal with a local oscillator signal, the multiplication will tend to produce both an upper sideband signal having the frequency of the sum of the input signal frequency and the local oscillator frequency and also produce a lower sideband signal having the difference frequency between these two frequencies. As known in the I/Q mixer arts, the combination of the mixing of the in-phase components and the mixing of the quadrature-phase components in SSB mixer 105 functions ideally to cancel the lower sideband despite the multiplication of the respective signals so that it is just the upper sideband that is produced to drive the differential output signal at the nodes VOP and VON. But such ideal behavior does not exist in real-world circuits. In particular, the "push" to one of the nodes VOP and VON will generally not be exactly equal to the "pull" to the remaining one of the nodes VOP and VON. This asymmetry may primarily result from an inevitable asymmetry between the magnitude of I+ and I– components and also between the Q+ and Q– components. Ideally, I– equals –1 times I+ and Q– equals –1 times Q+. But these equalities may not be achieved in a real-world circuit. The result is that SSB mixer 105 will tend to produce odd multiples of the VCO frequency in the differential output signal at frequencies including fVCO, 3*fVCO, 5*fVCO, and so on.

Figure 3:
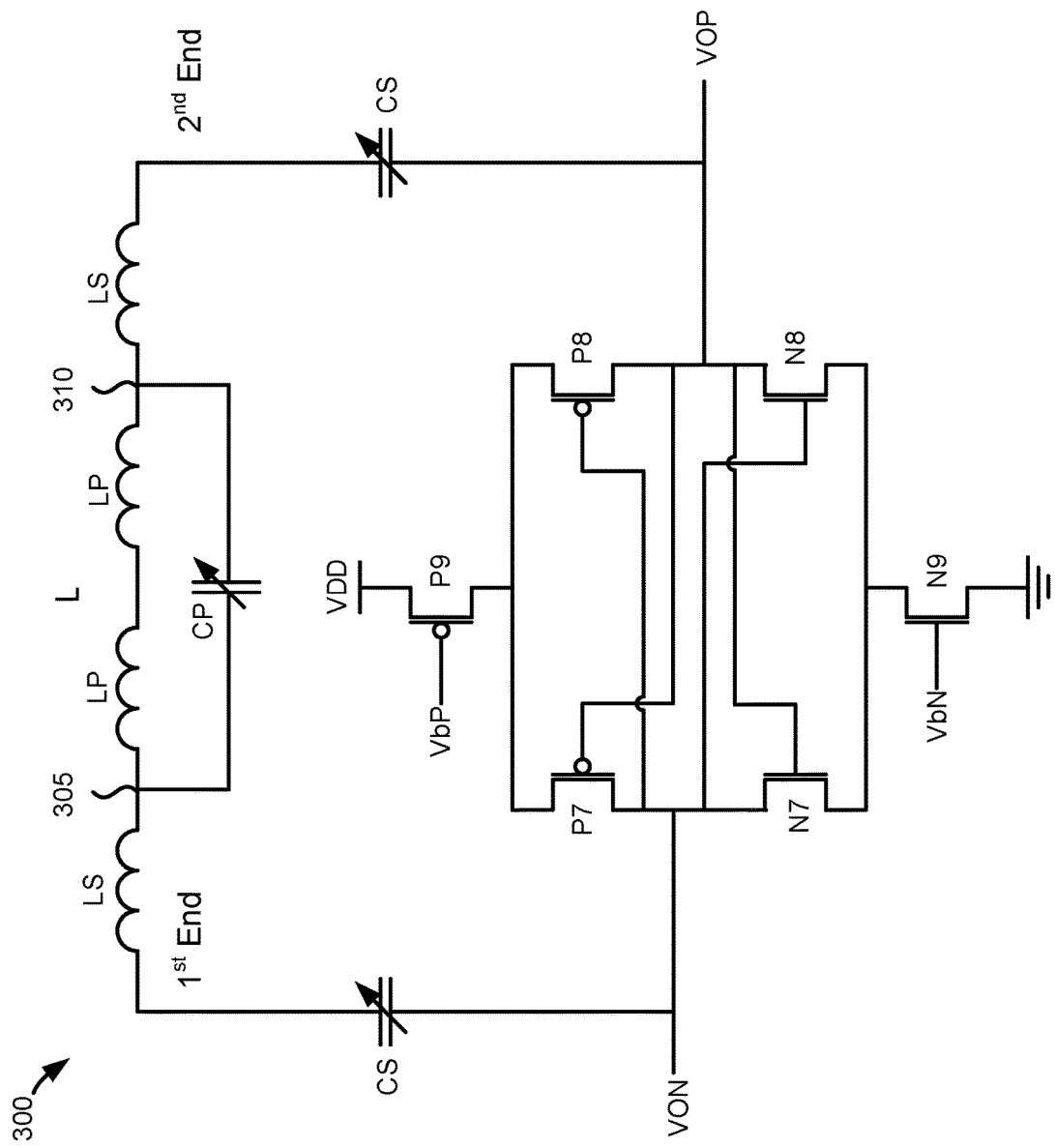
FIG. 3 is a circuit diagram of a DC-blocking output filter in accordance with an aspect of the disclosure.

To prevent these odd spurs and also the even spurs discussed previously, the Gilbert cells in SSB mixer 105 as shown in FIG. 1 are modified to include a DC-blocking output filter 125 that couples between the VOP and VON nodes and blocks DC. In some embodiments, output filter 125 is a dual-notch output filter having a first notch at the frequency fVCO and a second notch at 4*fVCO. Since output filter 125 blocks DC, the amplitude imbalances between I+ and I− components and also between Q+ and Q− components are blocked from affecting the differential output signal as only the differential-mode (equal but opposite values) of these signals can affect the differential output signal. The common-mode value of these signals that comes from their unequal values does not contribute substantially to the differential output signal. An example dual-notch embodiment 300 of output filter 125 is shown in FIG. 3. The dual notches in the frequency response of output filter 125 occur at 4fVCO, which is an octave above 2fVCO, and also at fVCO, which is an octave below 2fVCO. Although output filter 125 blocks DC, there may still be some residual amplitude mismatches between the I+ and I− components as well as between Q+ and Q− components that would produce spurs at fVCO and 4fVCO. The impedance of output filter 125 is relatively low at fVCO and 4fVCO such that these residual amplitude mismatches do not contribute substantially to the differential output signal. In contrast, the impedance of output filter 125 is relatively high at 2fVCO so that the desired frequency doubling is advantageously accentuated in the differential output signal. To produce the dual notches in its frequency response, output filter 125 includes an inductor L that is tapped at a tap 305 so as to present an inductance of LS in a portion of inductor L that extends from its first end to tap 305. Similarly, the inductor is tapped at a tap 310 so as to present the same inductance of LS from another portion of inductor L that extends from its second end to tap 310. The remaining inductance of a portion of inductor L that extends from tap 305 to tap 310 is designated as 2LP. To block DC, a capacitor CS connects between the VON node and first end of the inductor L. Similarly, a capacitor CS connects between the VOP node and the second end of the inductor L. In addition, a capacitor CP connects between taps 305 and 310. The capacitances CS and CP as well as the inductances LS and LP are selected or tuned to provide the notches (local minimums in impedance) at fVCO and 4fVCO as well as the local maximum impedance at 2fVCO. In particular, these capacitances and inductances preserve a ratio of 2 and ½ between the pole and zero frequencies in the frequency response for output filter 125. Note that the frequency doubling disclosed herein may be desired to be produced across some frequency range for the input signal. For example, the output frequency 2fVCO may be varied between 40 GHz and 50 GHz in some embodiments. In such embodiments, the input signal frequency would range from 20 GHz to 25 GHz. To provide the desired notches and peak impedances across this tuning range, capacitors CS and CP may be adjustable (tunable) capacitors such that their adjustment or tuning maintains a constant ratio of the CS/CP capacitances across the tuning range.

To increase the quality factor for output filter 125, a pair of cross-coupled inverters couple between the VON and VOP nodes. A first cross-coupled inverter is formed by a serial connection of a PMOS transistor P7 and an NMOS transistor N7. A second cross-coupled inverter is formed by a serial connection of a PMOS transistor P8 and an NMOS transistor N8. The sources of transistors P7 and P8 may couple to the power supply node through a PMOS transistor P9. Similarly, the sources of transistors N7 and N8 may couple to ground through an NMOS transistor N9. To adjust the action of the cross-coupled inverters, a tuning voltage VvP drives the gate of transistor P9 whereas a tuning voltage VpN drives the gate of transistor N9.

Figure 4:
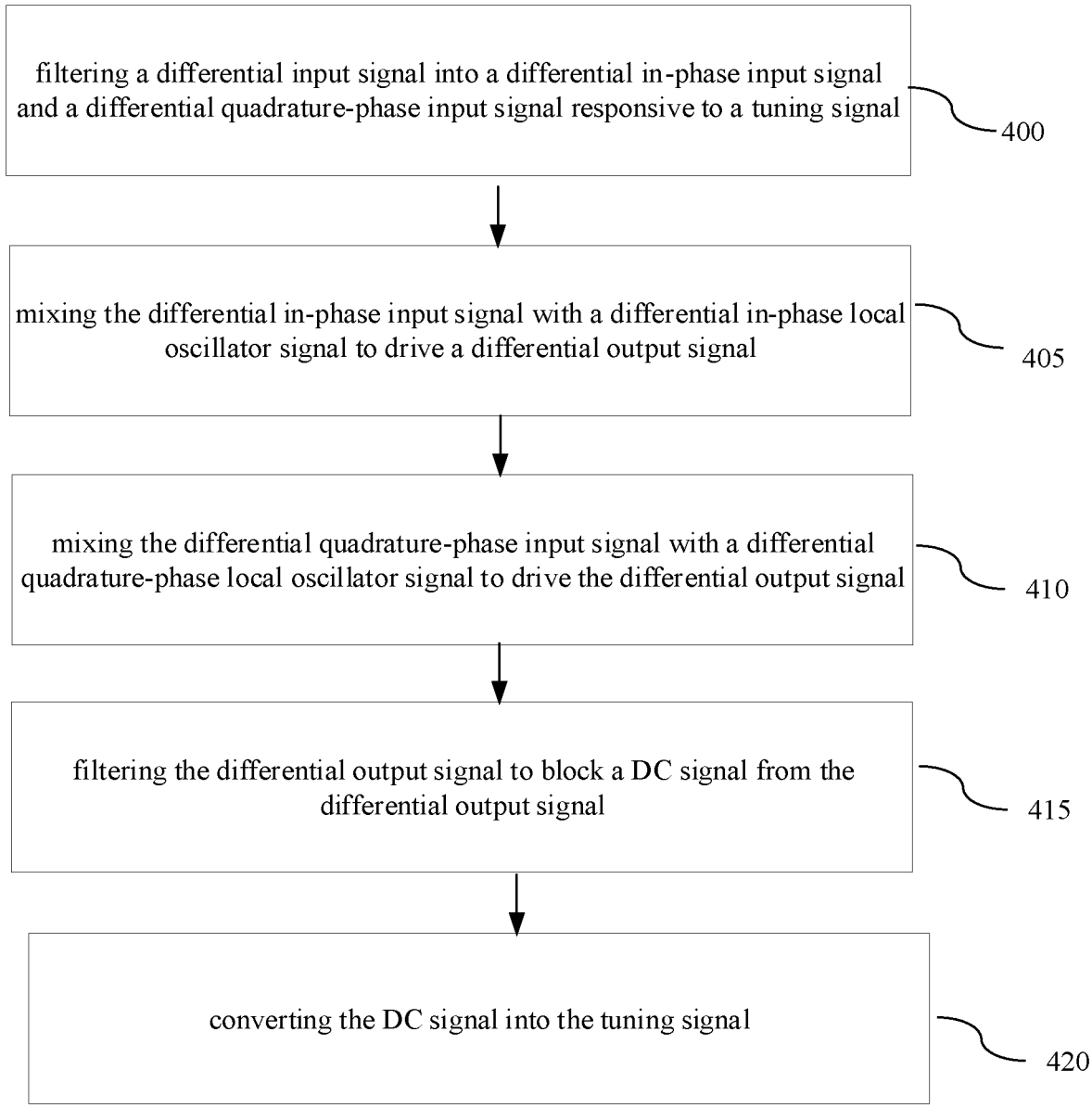
FIG. 4 is a flowchart of an example method of frequency doubling in accordance with an aspect of the disclosure.

A method of frequency doubling will now be discussed with regard to the flowchart of FIG. 4. The method includes an act 400 of filtering a differential input signal into a differential in-phase input signal and a differential quadrature-phase input signal responsive to a tuning signal. The filtering of the VCO input signal by polyphase filter 100 is an example of act 400. In addition, the method includes an act 405 of mixing the differential in-phase input signal with a differential in-phase local oscillator signal to drive a differential output signal. The mixing in Gilbert cells 200 and 205 is an example of act 405. The method also includes an act 410 of mixing the differential quadrature-phase input signal with a differential quadrature-phase local oscillator signal to drive the differential output signal. The mixing in Gilbert cells 215 and 220 is an example of act 410. The method further includes an act 415 of filtering the differential output signal to block a DC signal from the differential output signal. The filtering through output filter 125 is an example of act 415. Finally, the method includes an act 420 of converting the DC signal into the tuning signal. The conversion in transimpedance amplifier 130 is an example of act 420.

Figure 5:
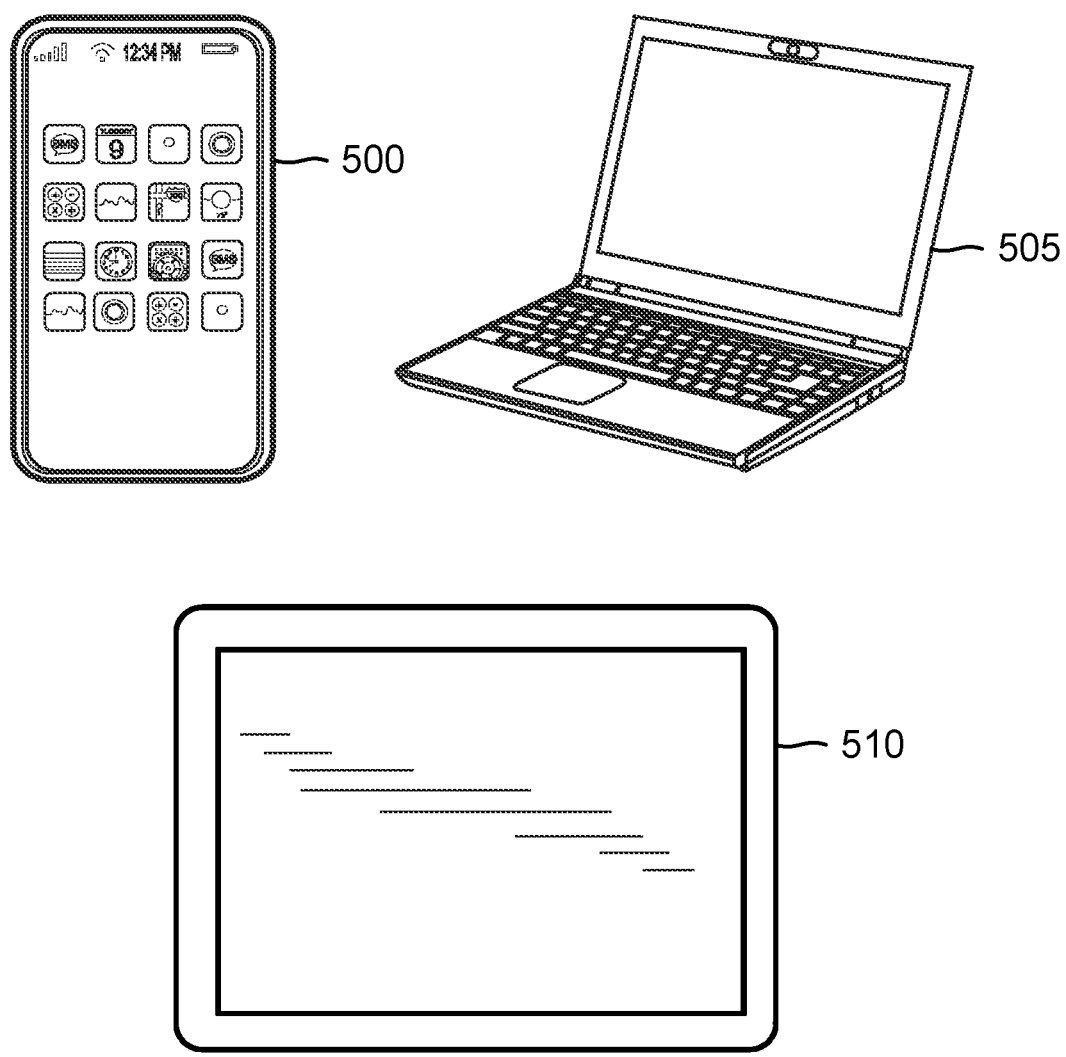
FIG. 5 illustrates some example wireless systems incorporating a frequency doubler in accordance with an aspect of the disclosure.

RF transceivers incorporating a frequency doubler as disclosed herein may be included within any suitable RF wireless component. For example, as shown in FIG. 5, a cell phone 500, a laptop 505, and a tablet PC 510 may all include a frequency doubler in accordance with the disclosure. Other exemplary electronic systems such as a music player, a video player, a communication device, and a personal computer may also be configured with frequency doublers constructed in accordance with the disclosure.

The disclosure will now be summarized with the following example clauses:

Clause 1. A frequency doubler, comprising:
a first pair of Gilbert cells configured to mix a differential in-phase input signal with a differential in-phase local oscillator signal to drive a differential output signal at a pair of output nodes;
a second pair of Gilbert cells configured to mix a differential quadrature-phase input signal with a differential quadrature-phase local oscillator signal to drive the differential output signal at the pair of output nodes; and
a frequency divider configured to divide the differential output signal into the differential in-phase local oscillator signal and into the differential quadrature-phase local oscillator signal.

Clause 2. The frequency doubler of clause 1, further comprising:
a DC-blocking output filter coupled between the pair of output nodes; and
a transimpedance amplifier configured to convert a DC current from the pair of output nodes into a tuning signal; and
a tunable input filter configured to convert a differential oscillator input signal into the differential in-phase input signal and into the differential quadrature-phase input signal responsive to the tuning signal.

Clause 3. The frequency doubler of clause 2, wherein the tunable input filter is a tunable polyphase filter.

Clause 4. The frequency doubler of any of clauses 1-2, wherein the frequency divider is further configured to divide the differential output signal into a pair of differential signals, the frequency doubler further comprising:
a selector circuit configured to select from the pair of differential signals to form the differential in-phase local oscillator signal and the differential quadrature-phase local oscillator signal.

Clause 5. The frequency doubler of any of clauses 2-4, wherein the first pair of Gilbert cells comprises a p-type metal-oxide semiconductor (PMOS) Gilbert cell including a plurality of PMOS transistors and an n-type metal-oxide semiconductor (NMOS) Gilbert cell including a plurality of NMOS transistors.

Clause 6. The frequency doubler of clause 5, further comprising:
a common-mode feedback circuit configured to adjust a common mode of the differential output signal to equal a reference voltage.

Clause 7. The frequency doubler of clause 5, wherein the plurality of PMOS transistors comprises:
a first PMOS transistor having a source connected to a power supply node and a gate configured to receive a positive component of the differential in-phase input signal; and
a second PMOS transistor having a source connected to the power supply node and a gate configured to receive a negative component of the differential in-phase input signal;
a third PMOS transistor having a source connected to a drain of the first PMOS transistor, a gate configured to receive a negative component of the differential in-phase local oscillator signal; and a drain connected to a positive output node in the pair of output nodes; and
a fourth PMOS transistor having a source connected to the drain of the first PMOS transistor, a gate configured to receive a positive component of the differential in-phase local oscillator signal; and a drain connected to a negative output node in the pair of output nodes.

Clause 8. The frequency doubler of clause 7, wherein the plurality of PMOS transistors further comprises:
a fifth PMOS transistor having a source connected to a drain of the second PMOS transistor, a gate configured to receive the positive component of the differential in-phase local oscillator signal; and a drain connected to the positive output node in the pair of output nodes; and
a sixth PMOS transistor having a source connected to the drain of the second PMOS transistor, a gate configured to receive the negative component of the differential in-phase local oscillator signal; and a drain connected to the negative output node in the pair of output nodes.

Clause 9. The frequency doubler of clause 5, wherein the plurality of NMOS transistors comprises:
a first NMOS transistor having a source connected to ground and a gate configured to receive a positive component of the differential in-phase input signal;
a second NMOS transistor having a source connected to ground and a gate configured to receive a negative component of the differential in-phase input signal;
a third NMOS transistor having a source connected to a drain of the first NMOS transistor, a gate configured to receive a positive component of the differential in-phase local oscillator signal; and a drain connected to a positive output node in the pair of output nodes; and
a fourth NMOS transistor having a source connected to the drain of the first NMOS transistor, a gate configured to receive a negative component of the differential in-phase local oscillator signal; and a drain connected to a negative output node in the pair of output nodes.

Clause 10. The frequency doubler of clause 9, wherein the plurality of NMOS transistors further comprises:
a fifth NMOS transistor having a source connected to a drain of the second NMOS transistor, a gate configured to receive the negative component of the differential in-phase local oscillator signal; and a drain connected to the positive output node in the pair of output nodes; and
a sixth NMOS transistor having a source connected to the drain of the second NMOS transistor, a gate configured to receive the positive component of the differential in-phase local oscillator signal; and a drain connected to the negative output node in the pair of output nodes.

Clause 11. The frequency doubler of any of clauses 2-10, wherein the DC-blocking output filter comprises:
an inductor having a first end, a second end, a first tap, and a second tap;
a first capacitor coupled between a positive output node in the pair of output nodes and the first end;
a second capacitor coupled between the first tap and the second tap; and
a third capacitor coupled between a negative output node in the pair of output nodes and the second end.

Clause 12. The frequency doubler of clause 11, wherein a capacitance of the first capacitor is equal to a capacitance of the third capacitor, and wherein an inductance of a first section of the inductor between the first end and the first tap is equal to an inductance of a second section of the inductor extending the second tap and the second end.

Clause 13. The frequency doubler of clause 12, wherein the inductor, the first capacitor, the second capacitor, and the third capacitor are configured such that a frequency response of the DC-blocking output filter has a first notch at a frequency of the differential in-phase input signal and has a second notch at four times the frequency of the differential in-phase input signal.

Clause 14. The frequency doubler of clause 11, further comprising a pair of cross-coupled inverters coupled between the positive output node and the negative output node.

Clause 15. The frequency doubler of clause 12, wherein the first capacitor, the second capacitor, and the third capacitor each comprises an adjustable capacitor.

Clause 16. The frequency doubler of any of clauses 2-15, wherein the frequency doubler is incorporated into a cellular telephone.

Clause 17. A method of frequency doubling, comprising:
filtering a differential input signal into a differential in-phase input signal and a differential quadrature-phase input signal responsive to a tuning signal;
mixing the differential in-phase input signal with a differential in-phase local oscillator signal to drive a differential output signal;
mixing the differential quadrature-phase input signal with a differential quadrature-phase local oscillator signal to drive the differential output signal;
filtering the differential output signal to block a DC signal from the differential output signal; and
converting the DC signal into the tuning signal.

Clause 18. The method of clause 17, further comprising:
dividing the differential output signal in frequency by a factor of two to form the differential in-phase local oscillator signal and the differential quadrature-phase local oscillator signal.

Clause 19. The method of clause 18, wherein filtering the output signal comprises filtering the output signal in a dual-notch output filter.

Clause 20. The method of clause 18, wherein the DC signal is a DC current and wherein converting the DC signal into the tuning signal comprising converting the DC current into a voltage tuning signal.

Clause 21. The method of clause 17, wherein filtering the differential input signal comprises filtering a differential VCO input signal.

Clause 22. The method of clause 21, wherein filtering the differential VCO input signal comprises filtering the differential VCO input signal in a polyphase filter responsive to the tuning signal to reduce an in-phase/quadrature-phase imbalance between the differential in-phase input signal and the differential quadrature-phase input signal.

Clause 23. A frequency doubler, comprising:
 a tunable input filter configured to filter a differential input signal responsive to a tuning signal to form a differential in-phase input signal and a differential quadrature-phase input signal;
 a frequency divider configured to divide a differential output signal in frequency by a factor of two to produce a differential in-phase local oscillator signal and a differential quadrature-phase local oscillator signal;
 a single sideband mixer configured to mix the differential in-phase input signal with the differential in-phase local oscillator signal and to mix the differential quadrature-phase input signal with the differential quadrature-phase local oscillator signal to produce the differential output signal at a pair of output nodes; and
 a DC-blocking output filter coupled between the pair of output nodes.

Clause 24. The frequency doubler of clause 23, further comprising:
 a transimpedance amplifier configured to convert a DC current from the pair of output nodes into the tuning signal.

Clause 25. The frequency doubler of any of clauses 23-24, wherein the single sideband mixer comprises a first pair of complementary Gilbert cells and a second pair of complementary Gilbert cells.

Clause 26. A method of frequency doubling, comprising;
 filtering a differential input signal responsive to a tuning signal into a differential in-phase input signal and a differential quadrature-phase input signal;
 dividing a differential output signal in frequency by a factor of two to form a differential in-phase local oscillator signal and a differential quadrature-phase local oscillator signal;
 forming the differential output signal by mixing the differential in-phase input signal with the differential in-phase local oscillator signal and by mixing the differential quadrature-phase input signal with the differential quadrature-phase local oscillator signal; and
 filtering the differential output signal in a DC-blocking output filter.

Clause 27. The method of clause 26, further comprising:
 converting a DC current signal from the DC-blocking output filter into the tuning signal.

Clause 28. The method of any of clauses 26-27, further comprising:
 generating the differential input signal in a voltage-controlled oscillator.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A frequency doubler, comprising:
 a first pair of Gilbert cells configured to mix a differential in-phase input signal with a differential in-phase local oscillator signal to drive a differential output signal at a pair of output nodes;
 a second pair of Gilbert cells configured to mix a differential quadrature-phase input signal with a differential quadrature-phase local oscillator signal to drive the differential output signal at the pair of output nodes; and
 a frequency divider configured to divide the differential output signal into the differential in-phase local oscillator signal and into the differential quadrature-phase local oscillator signal.

2. The frequency doubler of claim 1, further comprising:
 a DC-blocking output filter coupled between the pair of output nodes; and
 a transimpedance amplifier configured to convert a DC current from the pair of output nodes into a tuning signal; and
 a tunable input filter configured to convert a differential oscillator input signal into the differential in-phase input signal and into the differential quadrature-phase input signal responsive to the tuning signal.

3. The frequency doubler of claim 2, wherein the tunable input filter is a tunable polyphase filter.

4. The frequency doubler of claim 1, wherein the frequency divider is further configured to divide the differential output signal into a pair of differential signals, the frequency doubler further comprising:
 a selector circuit configured to select from the pair of differential signals to form the differential in-phase local oscillator signal and the differential quadrature-phase local oscillator signal.

5. The frequency doubler of claim 2, wherein the first pair of Gilbert cells comprises a p-type metal-oxide semiconductor (PMOS) Gilbert cell including a plurality of PMOS transistors and an n-type metal-oxide semiconductor (NMOS) Gilbert cell including a plurality of NMOS transistors.

6. The frequency doubler of claim 5, further comprising:
 a common-mode feedback circuit configured to adjust a common mode of the differential output signal to equal a reference voltage.

7. The frequency doubler of claim 5, wherein the plurality of PMOS transistors comprises:
 a first PMOS transistor having a source connected to a power supply node and a gate configured to receive a positive component of the differential in-phase input signal;
 a second PMOS transistor having a source connected to the power supply node and a gate configured to receive a negative component of the differential in-phase input signal;
 a third PMOS transistor having a source connected to a drain of the first PMOS transistor, a gate configured to receive a negative component of the differential in-phase local oscillator signal; and a drain connected to a positive output node in the pair of output nodes; and
 a fourth PMOS transistor having a source connected to the drain of the first PMOS transistor, a gate configured to receive a positive component of the differential in-phase local oscillator signal; and a drain connected to a negative output node in the pair of output nodes.

8. The frequency doubler of claim 7, wherein the plurality of PMOS transistors further comprises:

a fifth PMOS transistor having a source connected to a drain of the second PMOS transistor, a gate configured to receive the positive component of the differential in-phase local oscillator signal; and a drain connected to the positive output node in the pair of output nodes; and a sixth PMOS transistor having a source connected to the drain of the second PMOS transistor, a gate configured to receive the negative component of the differential in-phase local oscillator signal; and a drain connected to the negative output node in the pair of output nodes.

9. The frequency doubler of claim 5, wherein the plurality of NMOS transistors comprises:
a first NMOS transistor having a source connected to ground and a gate configured to receive a positive component of the differential in-phase input signal;
a second NMOS transistor having a source connected to ground and a gate configured to receive a negative component of the differential in-phase input signal;
a third NMOS transistor having a source connected to a drain of the first NMOS transistor, a gate configured to receive a positive component of the differential in-phase local oscillator signal; and a drain connected to a positive output node in the pair of output nodes; and
a fourth NMOS transistor having a source connected to the drain of the first NMOS transistor, a gate configured to receive a negative component of the differential in-phase local oscillator signal; and a drain connected to a negative output node in the pair of output nodes.

10. The frequency doubler of claim 9, wherein the plurality of NMOS transistors further comprises:
a fifth NMOS transistor having a source connected to a drain of the second NMOS transistor, a gate configured to receive the negative component of the differential in-phase local oscillator signal; and a drain connected to the positive output node in the pair of output nodes; and
a sixth NMOS transistor having a source connected to the drain of the second NMOS transistor, a gate configured to receive the positive component of the differential in-phase local oscillator signal; and a drain connected to the negative output node in the pair of output nodes.

11. The frequency doubler of claim 2, wherein the DC-blocking output filter comprises:
an inductor having a first end, a second end, a first tap, and a second tap;
a first capacitor coupled between a positive output node in the pair of output nodes and the first end;
a second capacitor coupled between the first tap and the second tap; and
a third capacitor coupled between a negative output node in the pair of output nodes and the second end.

12. The frequency doubler of claim 11, wherein a capacitance of the first capacitor is equal to a capacitance of the third capacitor, and wherein an inductance of a first section of the inductor between the first end and the first tap is equal to an inductance of a second section of the inductor extending between the second tap and the second end.

13. The frequency doubler of claim 12, wherein the inductor, the first capacitor, the second capacitor, and the third capacitor are configured such that a frequency response of the DC-blocking output filter has a first notch at a frequency of the differential in-phase input signal and has a second notch at four times the frequency of the differential in-phase input signal.

14. The frequency doubler of claim 11, further comprising a pair of cross-coupled inverters coupled between the positive output node and the negative output node.

15. The frequency doubler of claim 12, wherein the first capacitor, the second capacitor, and the third capacitor each comprises an adjustable capacitor.

16. The frequency doubler of claim 2, wherein the frequency doubler is incorporated into a cellular telephone.

17. A method of frequency doubling, comprising:
filtering a differential input signal into a differential in-phase input signal and a differential quadrature-phase input signal responsive to a tuning signal;
mixing the differential in-phase input signal with a differential in-phase local oscillator signal to drive a differential output signal;
mixing the differential quadrature-phase input signal with a differential quadrature-phase local oscillator signal to drive the differential output signal;
filtering the differential output signal to block a DC signal from the differential output signal; and
converting the DC signal into the tuning signal.

18. The method of claim 17, further comprising:
dividing the differential output signal in frequency by a factor of two to form the differential in-phase local oscillator signal and the differential quadrature-phase local oscillator signal.

19. The method of claim 18, wherein filtering the differential output signal comprises filtering the differential output signal in a dual-notch output filter.

20. The method of claim 18, wherein the DC signal is a DC current and wherein converting the DC signal into the tuning signal comprising converting the DC current into a voltage tuning signal.

21. The method of claim 17, wherein filtering the differential input signal comprises filtering a differential VCO input signal.

22. The method of claim 21, wherein filtering the differential VCO input signal comprises filtering the differential VCO input signal in a polyphase filter responsive to the tuning signal to reduce an in-phase/quadrature-phase imbalance between the differential in-phase input signal and the differential quadrature-phase input signal.

23. A frequency doubler, comprising:
a tunable input filter configured to filter a differential input signal responsive to a tuning signal to form a differential in-phase input signal and a differential quadrature-phase input signal;
a frequency divider configured to divide a differential output signal in frequency by a factor of two to produce a differential in-phase local oscillator signal and a differential quadrature-phase local oscillator signal;
a single sideband mixer configured to mix the differential in-phase input signal with the differential in-phase local oscillator signal and to mix the differential quadrature-phase input signal with the differential quadrature-phase local oscillator signal to produce the differential output signal at a pair of output nodes; and
a DC-blocking output filter coupled between the pair of output nodes.

24. The frequency doubler of claim 23, further comprising:
a transimpedance amplifier configured to convert a DC current from the pair of output nodes into the tuning signal.

25. The frequency doubler of claim 23, wherein the single sideband mixer comprises a first pair of complementary Gilbert cells and a second pair of complementary Gilbert cells.

26. A method of frequency doubling, comprising;
filtering a differential input signal responsive to a tuning signal into a differential in-phase input signal and a differential quadrature-phase input signal;
dividing a differential output signal in frequency by a factor of two to form a differential in-phase local oscillator signal and a differential quadrature-phase local oscillator signal;
forming the differential output signal by mixing the differential in-phase input signal with the differential in-phase local oscillator signal and by mixing the differential quadrature-phase input signal with the differential quadrature-phase local oscillator signal; and
filtering the differential output signal in a DC-blocking output filter.

27. The method of claim 26, further comprising:
converting a DC current signal from the DC-blocking output filter into the tuning signal.

28. The method of claim 26, further comprising:
generating the differential input signal in a voltage-controlled oscillator.

\* \* \* \* \*